United States Patent [19]
Fukumoto et al.

[11] Patent Number: 6,105,160
[45] Date of Patent: *Aug. 15, 2000

[54] PACKET ERROR DETECTING DEVICE IN A DMA TRANSFER

[75] Inventors: Keisuke Fukumoto, Tokyo; Mikiharu Yamashita, Fukuoka, both of Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/995,862

[22] Filed: Dec. 22, 1997

[30] Foreign Application Priority Data

Dec. 24, 1996 [JP] Japan ................................ 8-343130

[51] Int. Cl.⁷ ................................................ H03M 13/00
[52] U.S. Cl. ...................... 714/776; 714/752; 714/753; 714/746; 714/764; 370/351
[58] Field of Search ........................... 370/351; 714/776, 714/752, 753, 764, 765, 48, 746, 758, 781, 784, 785

[56] References Cited

U.S. PATENT DOCUMENTS

| | | | |
|---|---|---|---|
| 5,430,842 | 7/1995 | Thompson | 709/236 |
| 5,515,362 | 5/1996 | Iwase | 370/228 |
| 5,712,862 | 1/1998 | Fujita et al. | 714/800 |
| 5,752,078 | 5/1998 | Delp et al. | 395/827 |

FOREIGN PATENT DOCUMENTS

| | | |
|---|---|---|
| 63-136234 | 6/1988 | Japan . |
| 2-41050 | 2/1990 | Japan . |
| 2-119319 | 5/1990 | Japan . |
| 2-181248 | 7/1990 | Japan . |
| 3-204257 | 9/1991 | Japan . |
| 3-233742 | 10/1991 | Japan . |
| 4-107014 | 4/1992 | Japan . |
| 4-322530 | 11/1992 | Japan . |
| 5-35616 | 2/1993 | Japan . |
| 5-37497 | 2/1993 | Japan . |
| 5-75577 | 3/1993 | Japan . |
| 5-91090 | 4/1993 | Japan . |
| 6-68320 | 3/1994 | Japan . |
| 6-78024 | 3/1994 | Japan . |
| 6-132970 | 5/1994 | Japan . |
| 6-214815 | 8/1994 | Japan . |
| 7-50652 | 2/1995 | Japan . |
| 7-177116 | 7/1995 | Japan . |

OTHER PUBLICATIONS

Prokin, "DMA Transfer method for Wide–Range Speed and Frequency Measurement", IEEE. pp. 842–846, Aug. 1993.

Prokin, "Speed Measurement Using teh Improved DMA Transfer Method", IEEE. pp. 476–483, Dec. 1991.

James E. Goldman, "Applied Data Communications a Business–Orented Approach" John Wiley & Sons, p. 77, 1995.

M. Honda et al., Development of an ATM Network Server, NEC Technology Bulletin, vol. 50, No. 6, Jul., 1997, pp. 114–119.

J. Touch, B. Parham, Implementing the Internet Checksum in Hardware, Internet RFC1936, Apr., 1996.

*Primary Examiner*—William Grant
*Assistant Examiner*—McDieunel Marc
*Attorney, Agent, or Firm*—Foley & Lardner

[57] ABSTRACT

A packet error detecting device for detecting the existence of an error of the packet data transferred by a packet switching in a DMA transfer, comprising an operation unit formed by hardware for executing a necessary operation to detect a packet error in the packet data received in every block, a DMA controller for DMA transferring data from a memory storing the received data to the operation unit, previous to the DMA transfer of the data toward an external device, and a CPU for performing an error procedure if detecting a packet error as the result of the error detection by the operation unit.

7 Claims, 5 Drawing Sheets

PACKET ERROR DETECTING DEVICE IN A DMA TRANSFER

BACKGROUNDS OF THE INVENTION

1. Field of the Invention

The present invention relates to a packet error detecting device for detecting the existence of error in the packet data transferred by the packet switching in a DMA transfer.

2. Description of the Related Art

Various devices for detecting a packet error have been proposed in order to improve reliability in the data transfer by packet switching for transferring data in every packet. Packet error detection in the packet switching in the DMA transfer has been generally performed by software without using any special hardware.

As the conventional packet error detecting devices, there are disclosed, for example, Japanese Patent Publication Laid-Open (Kokai) No. Heisei 2-41050 "Communication System", No. 2-119319 "CRC Code Generation Circuit", No. Heisei 3-204257 "Node Station", No. Heisei 4-107014 "Error Detection Method in CRC", No. Heisei 5-35616 "Data Transfer System" and No. Heisei 5-75577 "Data Error Detecting Device".

The Patent Publication No. Heisei 2-41050 "Communication System" discloses a communication system having sending units for sending the send data divided into a plurality of packets with detection codes respectively attached thereto and receiving units for receiving the packet data and instructing the sending units to resend only the packet having an error detected by use of the error detection code, wherein packet error detection can be performed in the receiving units.

The Patent Publication No. Heisei 2-119319 "CRC Code Generation Circuit" discloses a CRC code generation circuit for generating CRC code for use in packet error detection in the communication units of multi-lines, the CRC code generation circuit comprising a CRC operation circuit for performing CRC operation by entering the data string of multi-frame with a plurality of lines multiplexed, a flip-flop for storing the CRC operation results temporarily, a shift register for storing each final value of operation in each multi-frame line in the CRC operation results, and selecting units for selecting the content stored in the shift register at the first bit at the starting of the operation of each line and selecting the content stored in the flip-flop at another timing as the CRC operation value one bit ahead.

The Patent Publication No. Heisei 3-204257 "Node Station" discloses a node station of a data communication system for performing communication by use of a packet frame having frame check sequence over a loop-shaped network of signal transfers in a single direction, the node station comprising frame check units for detecting any error of frames of the whole packets relayed or received by use of the frame check sequence and storing units for storing the existence of the error if the frame check units detects an error, thereby enabling it to take away easily the channel having an error.

The Patent Publication No. Heisei 4-107014 "Error Detection Method in CRC" discloses a CRC error detection method of operation using a remainder obtained by dividing the code polynomial for N bits by the generating function as the redundancy check code for error detection, in which operation is performed in every n bits (n>1), thereby shortening the operation time.

The Patent Publication No. Heisei 5-35616 "Data Transfer System" discloses a data transfer system, in which the parity code and the CRC code are attached to the send data, so to transfer the data to the bus, the parity check and the CRC check are performed in a receiving device having received the data, and only when no error is detected, the data is supplied to the hardware, thereby detecting the occurrence of a bus error accurately and preventing the transfer of the wrong data into the hardware at the occurrence of a bus error.

The Patent Publication No. Heisei 5-75577 "Data Error Detecting Device" discloses a data error detecting device capable of real-time processing and eliminating a buffer memory for storing data temporarily, the device comprising a CRC operation unit for supplying a remainder obtained by dividing the input data by the generating function, as the operation data, and an error analytical unit for converting the operation data, upon receipt of it, into the bit error data corresponding to the operation data, so to supply the data.

These conventional packet error detecting devices, however, are not designed to be used in the DMA transfer and these techniques cannot be used to detect a packet error in the DMA transfer as they are.

The Patent Publication No. Heisei 2-181248 "DMA System" discloses a DMA system having a descriptor pointer register sequentially incremented for storing a head pointer of a descriptor table corresponding to a receive frame, a store descriptor pointer register for storing a head descriptor pointer of a descriptor table corresponding to a receive frame, and a status control unit for detecting an error of a receive frame, the system improving the processing speed of the DMA transfer by, if detecting an error in a receive frame, storing the head pointer of the receive frame stored in the store descriptor pointer register and transferring the next receive frame to the buffer according to the same content of the descriptor table. This publication, however, includes no description about the technique of detecting a packet error.

As mentioned above, the conventional method of detecting a packet error in the DMA transfer has a defect that the processing speed is slow because the packet error detection is performed by the software operation.

SUMMARY OF THE INVENTION

An object of the present invention is to provide a packet error detecting device capable of speeding up the packet error detection processing by detecting an error of packet data by use of a hardware operation unit.

Another object of the present invention is to provide a flexible packet error detecting device capable of performing an adequate error procedure depending on the content of an error, or performing an error detection in any protocol, by use of a hardware operation unit.

According to one aspect of the invention, a packet error detecting device for detecting the existence of an error in the packet data transferred by the packet switching in a DMA transfer, comprises an operation unit for executing a necessary operation to detect a packet error in the packet data received in every block, which operation unit is formed by hardware, a DMA control unit for DMA transferring data from a memory storing the receive data to the operation unit, previous to the DMA transfer of the data toward an external device, and a CPU for performing an error procedure if detecting a packet error as the result of the error detection by the operation unit.

The operation unit may be an operation device for executing the Bit Interleaved Parity operation.

In the preferred construction, the operation unit is an operation device for executing the Bit Interleaved Parity operation, the operation unit further comprises a timing generation unit for supplying an enabling signal for latching the packet data at a timing, a BIP operation unit for latching the packet data at the timing of the enabling signal and executing the Bit Interleaved Parity operation, and an operation result register for storing the operation results of the BIP operation unit and supplying the operation results in response to a request from the CPU.

In a preferred embodiment, the operation unit is an operation device for executing the Bit Interleaved Parity operation, the operation unit further comprises a counter function-attached timing generation unit for supplying an enabling signal for latching an internet protocol packet at a timing and generating and supplying a latch signal for latching check data included in the internet protocol packet based on the information on the packet length, a data latch unit for latching the check data included in the internet protocol packet according to the latch signal, a BIP operation unit for latching the packet data at the timing of the enabling signal and executing the Bit Interleaved Parity operation, and a compare unit for making a comparison between the check data latched by the data latch unit and the operation results of the BIP operation unit, and the CPU performs an adequate error procedure depending on the content of the packet error based on the comparison results of the compare unit.

The operation unit may be formed from a programmable logical circuit block.

In another preferred embodiment, the operation unit includes a field programmable gate array, and rewritable storing unit for storing the data for setting the components of the field programmable gate array.

According to another aspect of the invention, a packet error detecting device for detecting the existence of an error in the packet data transferred by the packet switching in a DMA transfer, comprises a memory for storing received data, an operation unit for executing a necessary operation to detect a packet error in the packet data received in every block, which operation unit is formed by hardware, a DMA controller for DMA transferring data from a memory storing the received data to the operation unit, previous to the DMA transfer of the data toward an external device, a CPU for performing an error procedure if detecting a packet error as the result of the error detection by the operation unit, and a common bus for connecting the memory, operation means, DMA controller, and CPU as a transfer channel of the data, the common bus having a line connected to an external device.

In the preferred embodiment, the operation unit is an operation device for executing the Bit Interleaved Parity operation, the operation unit further comprises a timing generation unit for supplying an enabling signal for latching the packet data at a timing, a BIP operation unit for latching the packet data at the timing of the enabling signal and executing the Bit Interleaved Parity operation, and an operation result register for storing the operation results of the BIP operation unit and supplying the operation results in response to a request from the CPU.

In the preferred embodiment, the operation unit is an operation device for executing the Bit Interleaved Parity operation, the operation unit further comprises a counter function-attached timing generation unit for supplying an enabling signal for latching an internet protocol packet at a timing and generating and supplying a latch signal for latching check data included in the internet protocol packet based on the information of the packet length, a data latch unit for latching the check data included in the internet protocol packet according to the latch signal, a BIP operation unit for latching the packet data at the timing of the enabling signal and executing the Bit Interleaved Parity operation, and a compare unit for making a comparison between the check data latched by the data latch unit and the operation results of the BIP operation unit, and the CPU performs an adequate error procedure depending on the content of the packet error based on the comparison results of the compare unit.

In another preferred embodiment, the operation unit includes a field programmable gate array, and rewritable storing unit for storing the data for setting the components of the field programmable gate array.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to limit the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
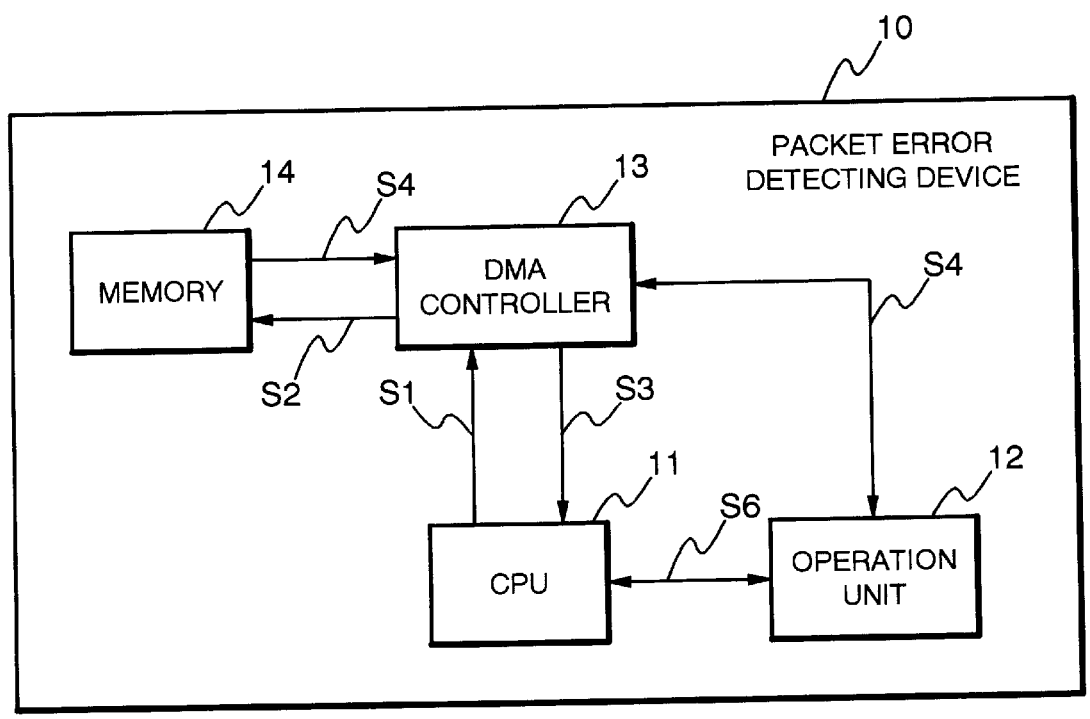
FIG. 1 is a block diagram showing a packet error detecting device according to embodiment of the present invention.

FIG. 1 is a block diagram showing a packet error detecting device according to an embodiment of the present invention. With reference to FIG. 1, the packet error detecting device 10 of the embodiment comprises a memory 14 for storing received data, a DMA controller 13 for controlling DMA (Direct Memory Access) transfer of data for the memory 14, an operation unit 12 for executing an operation for error check upon receipt of the data sent by the DMA controller 13 through the DMA transfer from the memory 14, and a CPU (Central Processing Unit) 11 for controlling the operation of the operation unit 12 and the DMA controller 13 and performing an error procedure upon receipt of error-detected signal data in the operation results by the operation unit 12. FIG. 1 shows only the characteristic components of the embodiment, while the descriptions of the other general components are omitted.

The CPU 11 supplies a transfer instructing signal s1 instructing the DMA controller 13 to transfer the received data to the memory 14 or a DMA transfer instructing signal s3 instructing the DMA controller 13 to perform the DMA transfer on the data stored in the memory 14, depending on the data source or the data destination. Upon receipt of the error detection results from the operation unit 12, when detecting an error, the CPU 11 performs an error procedure such as requesting the data source to resend the data and informing a user of the error occurrence.

The DMA controller 13, upon receipt of the transfer instructing signal s1 or the DMA transfer instructing signal s3 from the CPU 11, controls the data transfer according to the instruction of the signal. More specifically, when receiving the transfer instructing signal s1 from the CPU 11, the DMA controller 13 stores the data s2 received externally into the memory 14, and when receiving the DMA transfer instructing signal s3, it performs the DMA transfer on the data s4 stored in the memory 14 so as to transfer the data to a specified destination. The destination of the DMA transfer includes the operation unit 12.

The operation unit 12 checks an error for the data s4 received by the DMA transfer and notifies the CPU 11 of the error check results. As the result of the error check, when no error is detected, the CPU 11 having received the results supplies to the DMA controller 13 the DMA transfer instructing signal s3 for delivering the data s4 to an adequate destination by the DMA transfer. The operation unit 12 is formed by the hardware not by the software. The detailed structure of the operation unit 12 will be described later.

Figure 2:
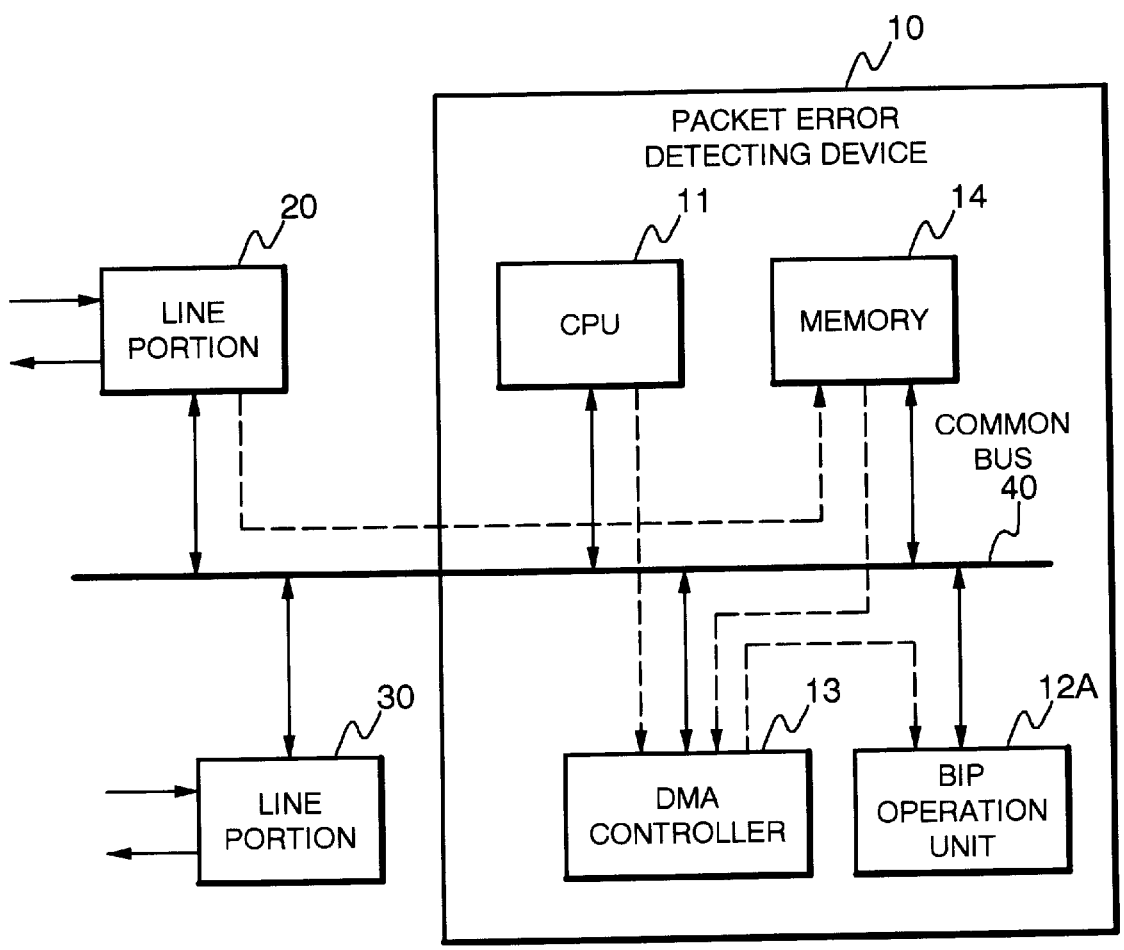
FIG. 2 is a block diagram showing an important portion of a communication system with the packet error detecting device of the embodiment mounted thereon.

FIG. 2 is a block diagram showing an important portion of a communication system with the packet error detecting device of the embodiment mounted thereon. The description will be made by way of example of a communication system for performing an error check of packet on the IP (Internet Protocol) packet by use of the packet error detecting device of this embodiment. IP is a typical protocol of the third layer of the network in the OSI (Open Systems Interconnection) reference model and it has a function of performing addressing and routing when transferring data.

With reference to FIG. 2, in the packet error detecting device 10, a BIP operation unit 12A for performing data check by executing the BIP (Bit Interleaved Parity)-16 operation is used as the operation unit 12. The BIP-16 operation refers to the operation to check the parity by use of the sum (EX-OR) of each bit in every 16 bits. In the check of IP packet, if there is no packet error, the BIP-16 operation results in "all 0". As illustrated, the CPU 11, the BIP operation unit 12A, the DMA controller 13, and the memory 14 are connected to line portions 20 and 30 via the common bus 40. The line portions 20 and 30 are respectively connected to the external devices for reading and writing the data for the memory 14.

Figure 3:
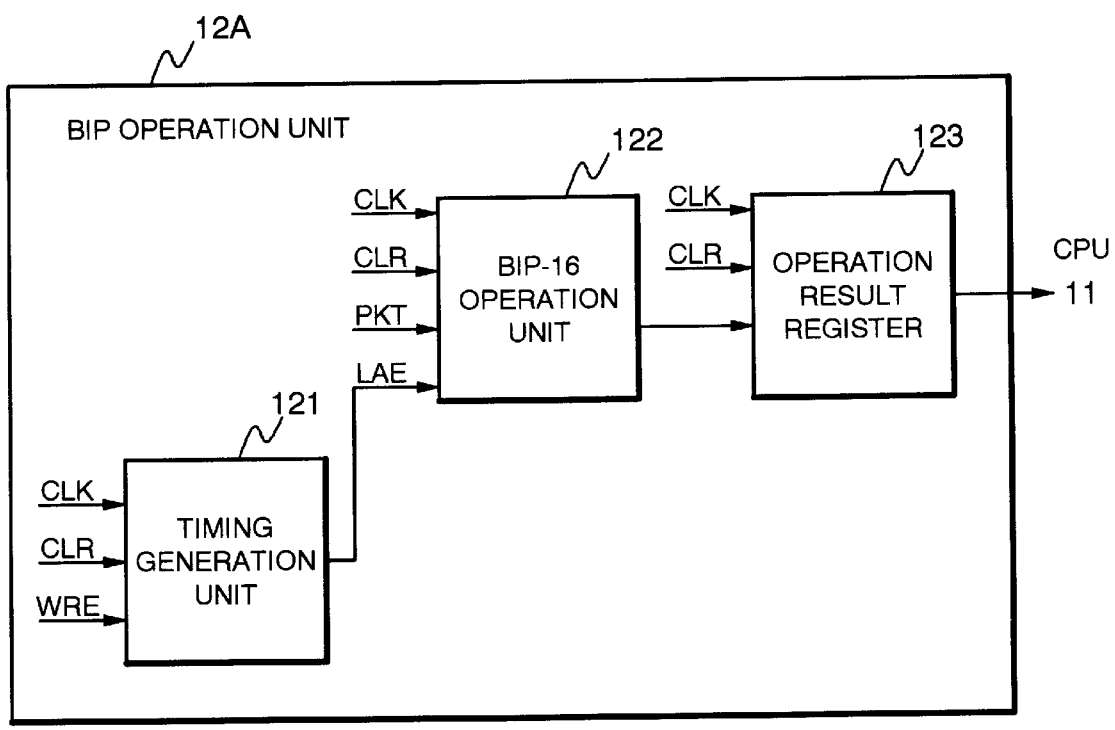
FIG. 3 is a block diagram showing an operation unit of the embodiment.

FIG. 3 shows the structure of the BIP operation unit 12A. With reference to FIG. 3, the BIP operation unit 12A comprises a timing generation unit 121 generating a latch enabling signal LAE for latching a packet PKT, a BIP-16 operation unit 122 executing the BIP-16 operation by latching the packet PKT at the timing of the latch enabling signal LAE, and an operation result register 123 storing the operation results of the BIP-16 operation unit 122.

According to the write enabling signal WRE included in the DMA transfer instructing signal s3 received from the DMA controller 13, the timing generation unit 121 generates a latch enabling signal LAE and supplies it to the BIP-16 operation unit 122. The timing generation unit 121 operates synchronously with the clock signal CLK and clears the data by the clear signal CLR.

The BIP-16 operation unit 122 latches the packet PKT at the timing of the latch enabling signal LAE received from the timing generation unit 121 and executes the BIP-16 operation. The BIP-16 operation unit 122 operates synchronously with the clock signal CLK and clears the data by the clear signal CLR.

The operation result register 123 stores and the operation results of the BIP-16 operation unit 122 and supplies the operation results depending on a request from the CPU 11. The operation result register 123 operates synchronously with the clock signal CLK and clears the data by the clear signal CLR.

The operation of the packet error detecting processing in the communication system shown in FIG. 2 will be described this time. Assume that the packet error detection is performed on the data to be transferred from an external device connected to the line portion 20 to an external device connected to the line portion 30 through the memory 14.

When the line portion 20 receives the data to be transferred to the line portion 30, the CPU 11 supplies the transfer instructing signal s1 to the DMA controller 13. Under the control of the DMA controller 13, the received data is built into packets and transferred to the memory 14 through the common bus 40.

After completion of the packet transfer, the CPU 11 supplies the DMA transfer instructing signal s3 to the DMA controller 13. Under the control of the DMA controller 13, the packet data stored in the memory 14 are read out and the data is DMA transferred to the BIP operation unit 12A.

The BIP operation unit 12A performs the error detection on the received packet data through the BIP-16 operation executed by the BIP-16 operation unit 122. The detected results are stored in the operation result register 123 and the BIP operation unit 12A notifies the CPU 11 that the operation has been completed.

The CPU 11, upon receipt of the notice from the BIP operation unit 12A, requests the operation results from the BIP operation unit 12A. The CPU 11 performs the predetermined processing according to the operation results obtained from the operation result register 123, namely the error detection results. When the operation results are "all 0", namely, there is no packet error, the CPU 11 supplies the DMA transfer instructing signal s3 again to the DMA controller 13 and under the control of the DMA controller 13, the packet data checked by the BIP operation unit 12A is DMA transferred from the memory 14 to the line portion 30. While, when the operation results are not "all 0", namely, there is detected a packet error, the CPU 11 performs the predetermined error procedure by the software processing. When the data received by line portion 20 is of the content requiring the data return such as address solution, the CPU 11 supplies the DMA transfer instructing signal s3 to the DMA controller 13 so as to DMA transfer the data from the memory 14 to the line portion 20.

As mentioned above, the BIP-16 operation of the packet data is performed by use of the BIP-16 operation unit 122 formed by the hardware, thereby realizing the higher-speed processing than the packet error detecting means by use of the software.

Figure 4:
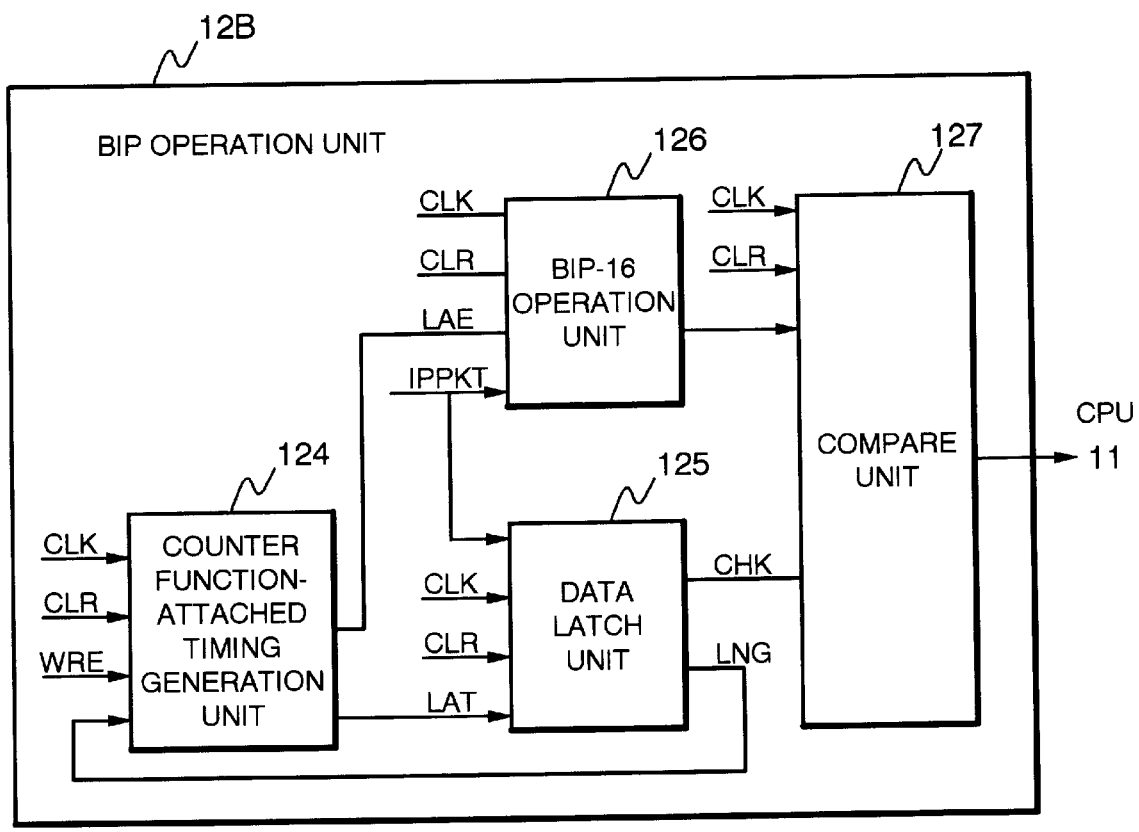
FIG. 4 is a block diagram showing another example of an operation unit of the embodiment.

FIG. 4 is a block diagram showing the constitution of another BIP operation unit 12B used as the operation unit 12 of the embodiment. With reference to FIG. 4, the BIP operation unit 12B comprises a counter function-attached timing generation unit 124 generating a latch enabling signal LAE for latching the IP packet IPPKT, a data latch unit 125 latching the check data included in the IP packet IPPKT, a BIP-16 operation unit 126 executing the BIP-16 operation by latching the IP packet IPPKT at the timing of the latch enabling signal LAE, and a compare unit 127 making a comparison between the operation results of the BIP-16 operation unit 126 and the data latched by the data latch unit 125. The IP packet IPPKT includes at least Total Length, Source Address, Destination Address, Protocol, and TCP Header Checksum of the IP header portion as the check data.

The counter function-attached timing generation unit 124 generates a latch enabling signal LAE and supplies it to the BIP-16 operation unit 126, according to the write enabling signal WRE included in the DMA transfer instructing signal s3 received from the DMA controller 13. Also, it generates a latch signal LAT and supplies it to the data latch unit 125. The counter function-attached timing generation unit 124 operates synchronously with the clock signal CLK and clears the data by the clear signal CLR.

The data latch unit 125 extracts the length information LNG from the IP packet IPPKT and sets the value of the length information LNG in the counter function-attached timing generation unit 124. The counter function-attached timing generation unit 124 thus generates the latch signal LAT for latching the check data according to the length information LNG. The data latch unit 125 latches the check data CHK included in the IP packet IPPKT according to the latch signal LAT received from the counter function-attached timing generation unit 124 and supplies it to the compare unit 127. The data latch unit 125 operates synchronously with the clock signal CLK and clears the data by the clear signal CLR.

The BIP-16 operation unit 126 latches the packet PKT at the timing of the latch enabling signal LAE received from the timing generation unit 124, executes the BIP-16 operation and supplies the operation results to the compare unit 127. The BIP-16 operation unit 126 operates synchronously with the clock signal CLK and clears the data by the clear signal CLR.

The compare unit 127 makes a comparison between the check data CHK received from the data latch unit 125 and the operation results received from the BIP-16 operation unit 126 and supplies the comparison results depending on a request from the CPU 11. The CPU 11 thus analyzes the comparison results by the compare unit 127 in the lead, thereby enabling it to identify the kind of an error having occurred and perform an adequate error procedure. The compare unit 127 operates synchronously with the clock signal CLK and clears the data by the clear signal CLR.

Figure 5:
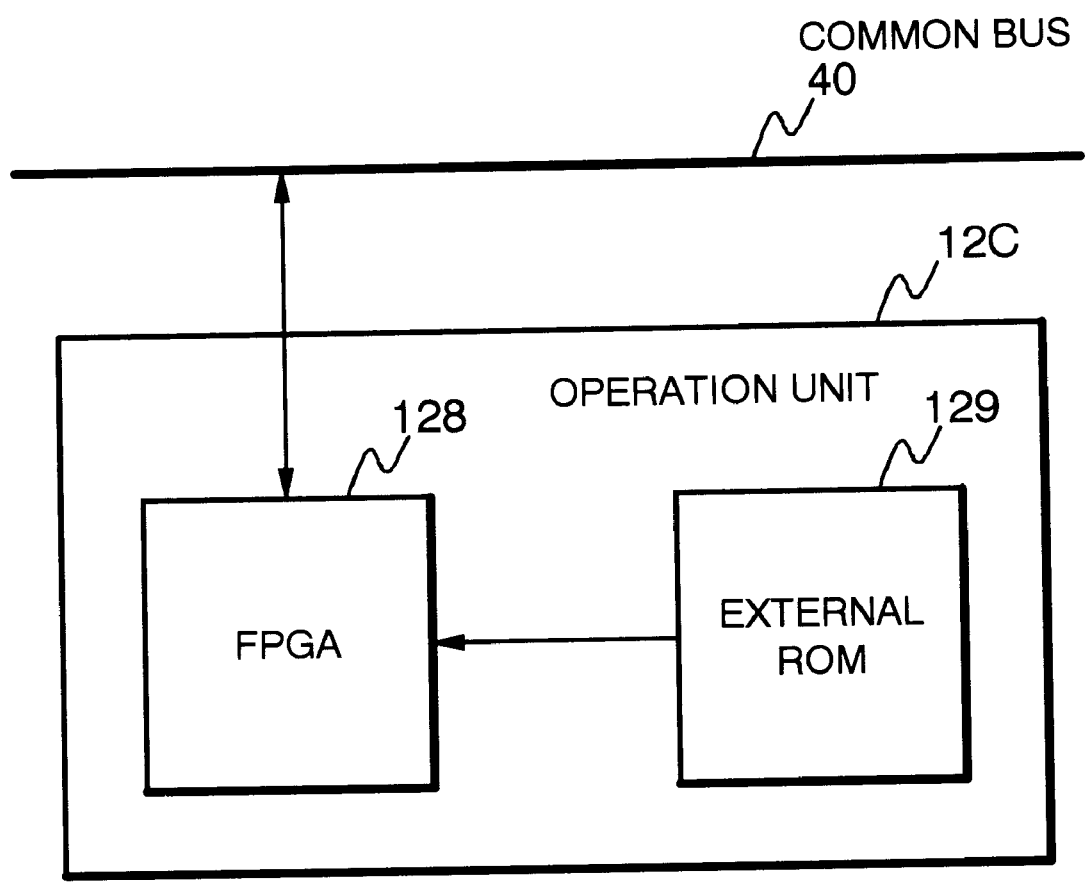
FIG. 5 is a block diagram showing a further example of an operation unit of the embodiment.

FIG. 5 is a block diagram showing another constitution of the operation unit 12 according to the embodiment. With reference to FIG. 5, the operation unit 12C comprises a field programmable gate array (FPGA) 128 connected to the common bus 40 and a rewrite-enabled external ROM 129. Any protocol becomes possible by rewriting the content of the external ROM 129 to set the component of the FPGA 128.

As set forth hereinabove, the packet error detecting device of the present invention executes the BIP operation for detecting an error of the packet data by use of the operation device formed by the hardware, thereby speeding up the packet error detection processing.

Further, the CPU can execute another processing during the BIP operation by the operation unit formed by the hardware, thereby improving the whole throughput.

Further, by the operation unit latching the check data included in the packet data, comparing it with the results of the BIP operation, and notifying the CPU of the comparison results, the CPU can identify the kind of an error and perform an adequate error procedure.

Further, by the operation unit formed with a field programmable gate array and a rewrite-enabled external ROM, error check can be performed on any protocol.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the appended claims.

What is claimed is:

1. A packet error detecting device for detecting the existence of an error in packet data transferred by packet switching in a DMA transfer, comprising:

operation means for executing a necessary operation to detect a packet error in the packet data received in every block, said operation means being formed by hardware;

DMA control means for DMA transferring data from a memory storing the received data to said operation means, previous to the DMA transfer of the data toward an external device; and a CPU for performing an error procedure if a packet error is detected as the result of the error detecting by said operation means, wherein said operation means is an operation device for executing a Bit Interleaved Parity operation for all bits in the packet data that correspond to an entire packet.

2. A packet error detecting device for detecting the existence of an error in packet data transferred by packet switching in a DMA transfer, comprising:

operation means for executing a necessary operation to detect a packet error in the packet data received in every block, said operation means being formed by hardware;

DMA control means for DMA transferring data from a memory storing the received data to said operation means, previous to the DMA transfer of the data toward an external device; and a CPU for performing an error procedure if a packet error is detected as the result of the error detecting by said operation means, wherein said operation means is an operation device for executing a Bit Interleaved Parity (BIP) operation, said operation means further comprising:
  timing generation means for supplying an enabling signal for latching the packet data at a timing,
  BIP operation means for latching the packet data at the timing of the enabling signal and executing the Bit Interleaved Parity operation for all bits in an entire packet, and
  an operation result register for storing the operation results of said BIP operation means and supplying the operation results in response to a request from said CPU.

3. A packet error detecting device for detecting the existence of an error in packet data transferred by packet switching in a DMA transfer, comprising:
  operation means for executing a necessary operation to detect a packet error in the packet data received in every block, said operation means being formed by hardware;
  DMA control means for DMA transferring data from a memory storing the received data to said operation means, previous to the DMA transfer of the data toward an external device; and
  a CPU for performing an error procedure if a packet error is detected as the result of the error detecting by said operation means,
  wherein said operation means is an operation device for executing a Bit Interleaved Parity (BIP) operation,
  said operation means further comprising
    counter function-attached timing generation means for supplying an enabling signal for latching an internet protocol packet at a timing and generating and supplying a latch signal for latching check data included in the internet protocol packet based on information of the packet length,
    data latch means for latching the check data included in the internet protocol packet according to the latch signal,
    BIP operation means for latching the packet data at the timing of the enabling signal and executing the Bit Interleaved Parity operation for all bits in an entire packet, and
    compare means for making a comparison between the check data latched by said data latch means and the operation results of said BIP operation means, and
  said CPU performs an adequate error procedure depending on the content of the packet error based on the comparison results of said compare means.

4. A packet error detecting device for detecting the existence of an error in packet data transferred by packet switching in a DMA transfer, comprising:
  a memory for storing received data;
  operation means for executing a necessary operation to detect a packet error in the packet data received in every block, said operation means being formed by hardware;
  DMA control means for DMA transferring data from a memory storing the received data to said operation means, previous to the DMA transfer of the data toward an external device;
  a CPU for performing an error procedure if a packet error is detected as the result of the error detection by said operation means; and
  a common bus for connecting said memory, operation means DMA control means, and CPU as a transfer channel of the data, said common bus having line means connected to an external device,
  wherein said operation means is an operation device for executing a Bit Interleaved Parity operation for all bits in the packet data that correspond to an entire packet.

5. A packet error detecting device for detecting the existence of an error in packet data transferred by packet switching in a DMA transfer, comprising:
  a memory for storing received data;
  operation means for executing a necessary operation to detect a packet error in the packet data received in every block, said operation means being formed by hardware;
  DMA control means for DMA transferring data from a memory storing the received data to said operation means, previous to the DMA transfer of the data toward an external device;
  a CPU for performing an error procedure if a packet error is detected as the result of the error detection by said operation means; and
  a common bus for connecting said memory, operation means, DMA control means, and CPU as a transfer channel of the data, said common bus having line means connected to an external device,
  wherein said operation means is an operation device for executing a Bit Interleaved Parity (BIP) operation,
  said operation means further comprising
    timing generation means for supplying an enabling signal for latching the packet data at a timing,
    BIP operation means for latching the packet data at the timing of the enabling signal and executing the Bit Interleaved Parity operation for all bits in an entire packet, and
    an operation result register for storing the operation results of said BIP operation means and supplying the operation results in response to a request from said CPU.

6. A packet error detecting device for detecting the existence of an error in the packet data transferred by packet switching in a DMA transfer, comprising:
  a hardware implemented operation unit for executing a necessary operation to detect a packet error in the packet data received in every block;
  a DMA controller for DMA transferring data from a memory storing the receive data to said operation unit, previous to the DMA transfer of the data toward an external device; and
  a CPU for performing an error procedure if a packet error is detected as the result of the error detecting by said operation unit,
  wherein said operation unit is an operation device for executing a Bit Interleaved Parity operation for all bits in the packet data that correspond to an entire packet.

7. A packet error detecting device for detecting the existence of an error in the packet data transferred by packet switching in a DMA transfer, comprising:
  a hardware implemented operation unit for executing a necessary operation to detect a packet error in the packet data received in every block;
  a DMA controller for DMA transferring data from a memory storing the receive data to said operation unit, previous to the DMA transfer of the data toward an external device; and
  a CPU for performing an error procedure if a packet error is detected as the result of the error detecting by said operation unit,
  wherein said operation unit is an operation device for executing a Bit Interleaved Parity (BIP) operation, said operation unit further comprising
- a timing generation unit for supplying an enabling signal for latching the packet data at a timing,
- a BIP operation unit for latching the packet data at the timing of the enabling signal and executing the Bit Interleaved Parity operation for all bits in an entire packet, and
- an operation result register for storing the operation results of said BIP operation unit and supplying the operation results in response to a request from said CPU.

* * * * *